US011450824B2

(12) United States Patent
Kim

(10) Patent No.: US 11,450,824 B2
(45) Date of Patent: Sep. 20, 2022

(54) DISPLAY DEVICE

(71) Applicant: Samsung Display Co., Ltd., Yongin-si (KR)

(72) Inventor: Minsoo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 16/869,263

(22) Filed: May 7, 2020

(65) Prior Publication Data

US 2020/0381638 A1 Dec. 3, 2020

(30) Foreign Application Priority Data

May 29, 2019 (KR) ........................ 10-2019-0062983

(51) Int. Cl.

| | |
|---|---|
| ***H01L 51/00*** | (2006.01) |
| ***H01L 27/32*** | (2006.01) |
| ***H01L 51/52*** | (2006.01) |
| ***H01L 51/56*** | (2006.01) |
| ***H05K 1/14*** | (2006.01) |
| ***H05K 5/00*** | (2006.01) |
| ***H05K 5/03*** | (2006.01) |

(52) U.S. Cl.

CPC ...... *H01L 51/0097* (2013.01); *H01L 27/3276* (2013.01); *H01L 51/5246* (2013.01); *H01L 51/56* (2013.01); *H05K 1/147* (2013.01); *H05K 5/0017* (2013.01); *H05K 5/03* (2013.01); *H01L 2251/5338* (2013.01); *H05K 2201/10128* (2013.01)

(58) Field of Classification Search

None

See application file for complete search history.

(56) References Cited

U.S. PATENT DOCUMENTS

| | | | | |
|---|---|---|---|---|
| 9,430,180 | B2 | 8/2016 | Hirakata et al. | |
| 9,535,522 | B2 | 1/2017 | Ahn | |
| 9,939,844 | B2 | 4/2018 | Choi et al. | |
| 10,192,949 | B2 | 1/2019 | Choi et al. | |
| 2011/0050657 | A1 | 3/2011 | Yamada | |
| 2012/0146886 | A1* | 6/2012 | Minami | G09G 3/325 345/80 |

(Continued)

FOREIGN PATENT DOCUMENTS

| | | |
|---|---|---|
| KR | 10-2017-0111827 A | 10/2017 |
| KR | 10-2017-0133200 A | 12/2017 |
| KR | 10-2017-0137259 A | 12/2017 |

*Primary Examiner* — J. E. Schoenholtz

(74) *Attorney, Agent, or Firm* — Lewis Roca Rothgerber Christie LLP

(57) ABSTRACT

A display device includes: a display panel including a plurality of light emitting elements and a plurality of pads electrically connected to the plurality of light emitting elements; and a printed circuit board electrically connected to the plurality of pads. The display panel has first through sixth areas, with the second through sixth areas extending from different sides of the first area. T sixth area has an upper area extending from the fourth area, a bending area extending from the upper area, and a lower area extending from the bending area. The plurality of pads is on the lower area. The bending area of the sixth area is bent such that the lower area of the sixth area and the printed circuit board are parallel to the first area.

18 Claims, 15 Drawing Sheets

TA1 TA4 WM ISS DM DP AR4 AR1 AR-H BA AR6 AR-L PCB-M PFM I I'

PT1 PT2 FRM-1 PT4 PT3 DR3 DR1 DR2 AA

(56) References Cited

U.S. PATENT DOCUMENTS

| | | | | |
|---|---|---|---|---|
| 2013/0002133 | A1* | 1/2013 | Jin | H01L 51/0097 313/511 |
| 2014/0132488 | A1 | 5/2014 | Kim et al. | |
| 2016/0227654 | A1 | 8/2016 | Kim et al. | |
| 2017/0098794 | A1* | 4/2017 | Cho | H01L 51/52 |
| 2017/0287992 | A1 | 10/2017 | Kwak et al. | |
| 2017/0288006 | A1* | 10/2017 | Yang | G09F 9/301 |
| 2019/0004360 | A1* | 1/2019 | Aoki | H01L 51/0097 |
| 2019/0152129 | A1 | 5/2019 | Franklin et al. | |

* cited by examiner

DISPLAY DEVICE

CROSS-REFERENCE TO RELATED APPLICATION

This application claims priority to and the benefit of Korean Patent Application No. 10-2019-0062983, filed on May 29, 2019 in the Korean Intellectual Property Office, the entire content of which is hereby incorporated by reference.

BACKGROUND

1. Field

Aspects of embodiments of the present inventive concepts relate to a display device.

2. Related Art

A variety of display devices have been developed that are used in multimedia applications, such as televisions, mobile phones, navigation systems, computer monitors, and game consoles. A display device generally includes a display panel for providing a user with an image having certain information (e.g., for displaying the image to the user) and a window member protecting the display panel.

Display devices have been developed in which edge portions of a display area are bent to have a curvature (e.g., a certain curvature) to improve aesthetic impressions.

An issue that arises when fabricating the curved edge portions is that the durability of some components constituting the display device may be reduced.

SUMMARY

Some example embodiments of the present inventive concepts provide a display device providing improved aesthetic impressions and increased durability.

According to an example embodiment of the present inventive concepts, a display device includes: a display panel including a plurality of light emitting elements and a plurality of pads electrically connected to the plurality of light emitting elements; and a printed circuit board electrically connected to the plurality of pads. The display panel has: a first area having a first side, a second side extending in a direction crossing the first side, a third side parallel to the first side, and a fourth side parallel to the second side; a second area extending from the first side, at least a portion of the second area being bent; a third area extending from the second side, at least a portion of the third area being bent; a fourth area extending from the third side, at least a portion of the fourth area being bent; a fifth area extending from the fourth side, at least a portion of the fifth area being bent; and a sixth area having an upper area extending from the fourth area, a bending area extending from the upper area, and a lower area extending from the bending area, the plurality of pads being on the lower area. The bending area of the sixth area is bent such that the lower area of the sixth area and the printed circuit board are parallel to the first area.

An angle between the upper area and the lower area may be in a range from 80° to 100°.

The display device may further include: a window member above the display panel; and a frame below the display panel. The window member has: a first transmission part overlapping the first area; a second transmission part overlapping the second area, at least a portion of the second transmission part being bent; a third transmission part overlapping the third area, at least a portion of the third transmission part being bent; a fourth transmission part overlapping the fourth area, at least a portion of the fourth transmission part being bent; and a fifth transmission part overlapping the fifth area, at least a portion of the fifth transmission part being bent.

The frame may include: a base frame supporting one or more of the printed circuit board and a portion of the display panel; and a protrusion protruding from the base frame and being between the fourth transmission part of the window member and the sixth area of the display panel.

The base frame may have: a window support surface supporting the window member; a first curved surface supporting the bending area of the display panel and spaced apart from the window support surface, the first curved surface having a curvature; and a main support surface supporting one of the printed circuit board and the lower area of the display panel, the main support surface extending from the first curved surface.

The protrusion may have: a second curved surface supporting the bending area of the display panel and extending from the first curved surface, the second curved surface having a curvature; and a side surface extending in a direction intersecting the window support surface and extending between the window support surface and the second curved surface.

The display device may further include an adhesive member between the window support surface and the window member.

The display device may further include an adhesive member between the first curved surface and the bending area of the display panel.

The display device may further include a support member supporting the display panel. At least a portion of the support member may be between the display panel and the frame.

The frame may include: a base frame supporting one or more of the printed circuit board and a portion of the display panel; a first protrusion protruding from the base frame and adjacent to the second transmission part of the window member, the first protrusion extending parallel to the first side; a second protrusion protruding from the base frame and adjacent to the third transmission part of the window member, the second protrusion extending parallel to the second side; a third protrusion protruding from the base frame and adjacent to the fourth transmission part of the window member, the third protrusion extending parallel to the third side; and a fourth protrusion protruding from the base frame and adjacent to the fifth transmission part of the window member, the fourth protrusion extending parallel to the fourth side.

The first side, the second side, the third side, and the fourth side of the first area may not contact each other.

According to an example embodiment of the present inventive concepts, a display device includes a display panel. The display panel has: a main display area; a sub-display area extending from the main display area, at least a portion of the sub-display area being bent; a first non-display area extending from the sub-display area; a bending area extending from the first non-display area; and a second non-display area extending from the bending area, a data driver circuit being mounted on the second non-display area. The bending area is bent such that the second non-display area is parallel to the main display area.

An angle between the first non-display area and the second non-display area may be in a range from 80° to 100°.

The main display area and the sub-display area may include a plurality of light emitting elements, the second non-display area may include a plurality of pads that are configured to transmit an electrical signal to the plurality of light emitting elements, and the display device may further include a printed circuit board that is electrically connected to the plurality of pads and is parallel to the main display area.

The display device may further include: a window member above the display panel; and a frame below the display panel. The window member has: a main transmission part overlapping the main display area; and a sub-transmission part overlapping the sub-display area.

The frame may include: a base frame; and a protrusion protruding from the base frame and being between the sub-transmission part of the window member and the bending area of the display panel.

The base frame may have: a window support surface supporting the window member; a first curved surface spaced apart from the window support surface and supporting the bending area of the display panel, the first curved surface having a curvature; and a main support surface supporting the second non-display area of the display panel and extending from the first curved surface.

The protrusion may have: a second curved surface supporting the bending area of the display panel and extending from the first curved surface, the second curved surface having a curvature; and a side surface extending in a direction crossing the window support surface and extending between the window support surface and the second curved surface.

The display device may further include an adhesive member between the window support surface and the window member.

The display device may further include an adhesive member between the first curved surface and the bending area of the display panel.

DETAILED DESCRIPTION

Figure 1A:
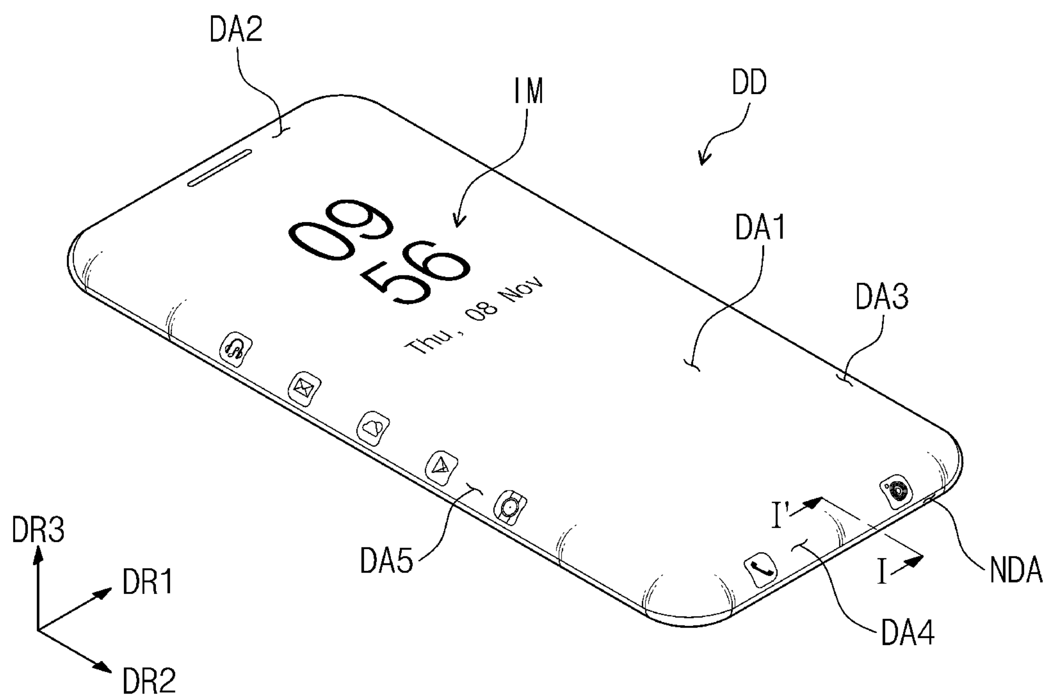
FIG. 1A is a perspective view of a display device according to an example embodiment of the present inventive concepts.

Some example embodiments of the present inventive concepts are described, in detail, below in conjunction with the accompanying drawings.

In the drawings, the proportions and dimensions of components may be exaggerated to more clearly explain the technical contents. Further, the same reference numerals designate the same elements.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It should also be understood that the terms "comprise," "include," "have," and the like are used to specify the presence of stated features, integers, steps, operations, components, elements, or combinations thereof but do not preclude the presence or addition of one or more other features, integers, steps, operations, components, elements, or combinations thereof.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Figure 1B:
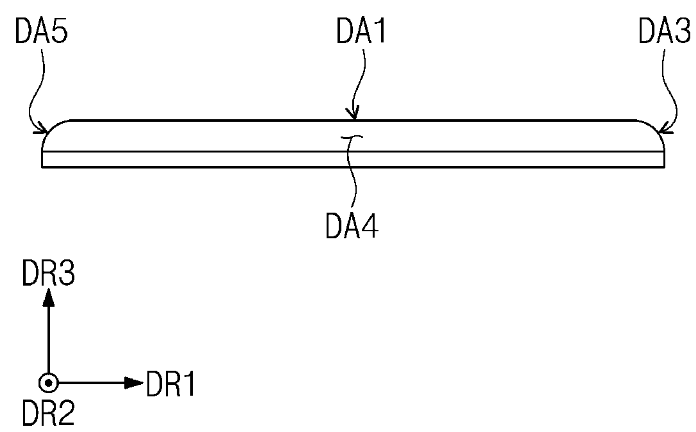
FIGS. 1B and 1C are different side views of the display device depicted in FIG. 1A.
Figure 1C:
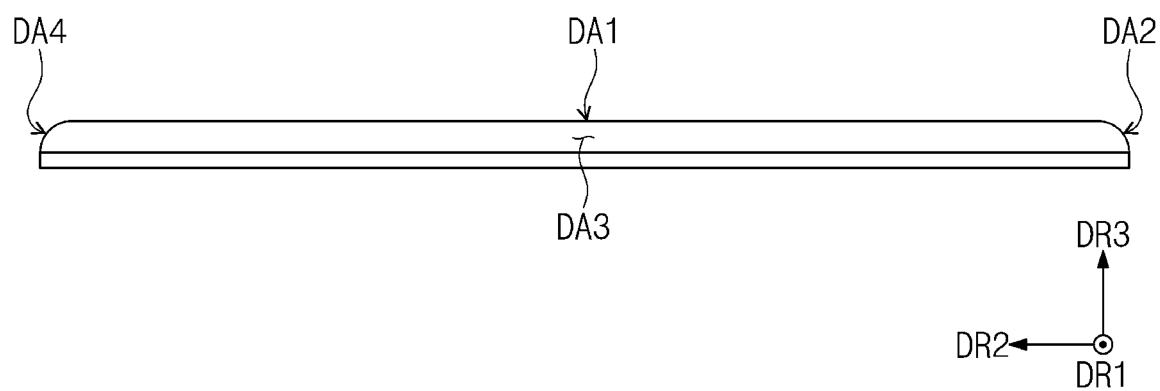

FIG. 1A is a perspective view of a display device DD according to an example embodiment of the present inventive concepts. FIGS. 1B and 1C are different side views of the display device DD depicted in FIG. 1A.

FIGS. 1A to 1C exemplarily show a smart phone as an example of the display device DD. However, the present inventive concepts are not limited thereto, and the display device DD may be applicable to (or embodied as) large-sized electronic products, such as television sets and monitors, and also to small and middle-sized electronic products, such as portable phones, tablet PCs, automotive navigation systems, game consoles, and smart watches.

The display device DD may have display areas DA1, DA2, DA3, DA4, and DA5 on which an image IM is displayed and may also have a non-display area NDA where no image IM is displayed. FIG. 1A shows a clock and icon images as examples of the image IM.

The non-display area NDA is a region at where no image IM is displayed. The non-display area NDA may define a bezel region of the display device DD.

The non-display area NDA may surround (e.g., may surround a periphery of) the display areas DA1, DA2, DA3, DA4, and DA5. However, the present inventive concepts are not limited thereto, and the display areas DA1, DA2, DA3, DA4, and DA5 and the non-display area NDA may be variously designed to have different shapes relative to each other.

The display areas DA1, DA2, DA3, DA4, and DA5 may include a first display area DA1, a second display area DA2, a third display area DA3, a fourth display area DA4, and a fifth display area DA5.

The first display area DA1 is parallel to a plane defined by a first direction DR1 and a second direction DR2. A third direction DR3 indicates a normal direction of the first display area DA1 (e.g., a thickness direction of the display device DD). The third direction DR3 differentiates a front surface (or a top surface) and a rear surface (or a bottom surface) of each member. However, directions indicated by the first, second, and third directions DR1, DR2, and DR3 are relative concepts and may, thus, denote other directions. Hereinafter, first, second, and third directions are defined to refer to directions respectively indicated by the first, second, and third directions DR1, DR2, and DR3, and are allocated the same reference symbols thereto.

The second display area DA2 may extend on (e.g., may extend from or along) a first side of the first display area DA1. The third display area DA3 may extend on (e.g., may extend from or along) a second side of the first display area DA1. The fourth display area DA4 may extend on (e.g., may extend from or along) a third side of the first display area DA1. The fifth display area DA5 may extend on (e.g., may extend from or along) a fourth side of the first display area DA1.

Each of the second, third, fourth, and fifth display areas DA2, DA3, DA4, and DA5 may be bent to have a curvature (e.g., a certain curvature) in the third direction DR3.

The second to fifth display areas DA2 to DA5 that are bent to have a curvature may improve aesthetic impressions of the display device DD and may reduce an area of the non-display area NDA recognized by (or visible to) users.

Figure 2:
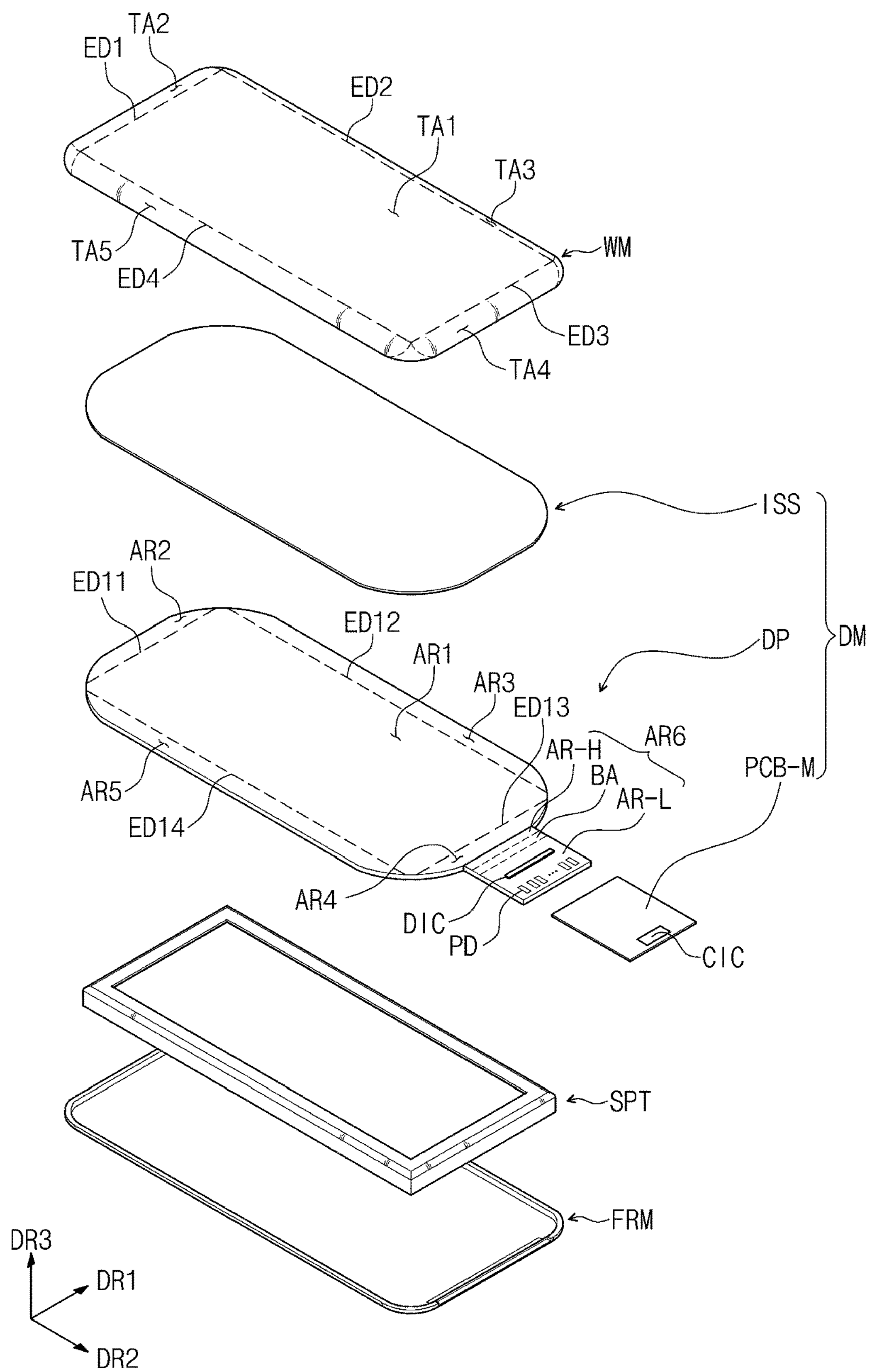
FIG. 2 is an exploded perspective view of a display device according to an example embodiment of the present inventive concepts.

FIG. 2 is an exploded perspective view of the display device DD according to an example embodiment of the present inventive concepts.

The display device DD may include a window member WM, a display module DM, a support member SPT, and a frame FRM.

The window member WM may be disposed above the display module DM. The window member WM may protect the display module DM against external impacts and the like.

The window member WM may include (or may be formed of) a transparent material. For example, the window member WM may include glass or transparent synthetic resin.

The window member WM may include transmission parts TA1, TA2, TA3, TA4, and TA5.

The transmission parts TA1, TA2, TA3, TA4, and TA5 may include a first transmission part TA1, a second transmission part TA2, a third transmission part TA3, a fourth transmission part TA4, and a fifth transmission part TA5.

The first transmission part TA1 is parallel to a plane defined by the first direction DR1 and the second direction DR2. The first transmission part TA1 may include a first side ED1 extending in a direction parallel to the first direction DR1, a second side ED2 extending from the first side ED1 in a direction parallel to the second direction DR2, a third side ED3 extending from the second side ED2 in the direction parallel to the first direction DR1, and a fourth side ED4 extending from the third side ED3 in the direction parallel to the second direction DR2. The first side ED1 and the third side ED3 may be parallel to each other, and the second side ED2 and the fourth side ED4 may be parallel to each other.

The second transmission part TA2 may extend on (e.g., may extend from or along) the first side ED1 of the first transmission part TA1. The third transmission part TA3 may extend on (e.g., may extend from or along) the second side ED2 of the first transmission part TA1. The fourth transmission part TA4 may extend on (e.g., may extend from or along) the third side ED3 of the first transmission part TA1. The fifth transmission part TA5 may extend on (e.g., may extend from or along) the fourth side ED4 of the first transmission part TA1.

Each of the second, third, fourth, and fifth transmission parts TA2, TA3, TA4, and TA5 may be bent to have a curvature (e.g., a certain curvature) in the third direction DR3.

The display module DM may include a display panel DP, a printed circuit board PCB-M, a data driver circuit DIC, a control circuit CIC, and an input detection sensor ISS.

The display panel DP may be a component that produces (e.g., displays or emits) an image (see, e.g., the image IM in FIG. 1A).

The display panel DP may include a first area AR1, a second area AR2, a third area AR3, a fourth area AR4, a fifth area AR5, and a sixth area AR6.

In this description, the first area AR1 may be called a main display area, and the fourth area AR4 may be called a sub-display area.

The first area AR1 may provide light to the first transmission part TA1. The second area AR2 may provide light to the second transmission part TA2. The third area AR3 may provide light to the third transmission part TA3. The fourth area AR4 may provide light to the fourth transmission part TA4. The fifth area AR5 may provide light to the fifth transmission part TA5.

The first area AR1 is parallel to a plane defined by the first direction DR1 and the second direction DR2. The first area AR1 may include a first side ED11 extending in the direction parallel to the first direction DR1, a second side ED12 extending in the direction parallel to the second direction DR2, a third side ED13 extending in the direction parallel to the first direction DR1, and a fourth side ED14 extending in the direction parallel to the second direction DR2. The first side ED11 and the third side ED13 may be parallel to each other, and the second side ED12 and the fourth side ED14 may be parallel to each other.

The second area AR2 may extend on (e.g., may extend from or along) the first side ED11 of the first area AR1. The third area AR3 may extend on (e.g., may extend from or along) the second side ED12 of the first area AR1. The fourth area AR4 may extend on (e.g., may extend from or along) the third side ED13 of the first area AR1. The fifth area AR5 may extend on (e.g., may extend from or along) the fourth side ED14 of the first area AR1.

The second to fifth areas AR2 to AR5 may be bent to have curvatures (e.g., certain curvatures) to respectively correspond to the second to fifth transmission parts TA2 to TA5 of the window member WM.

The first side ED11, the second side ED12, the third side ED13, and the fourth side ED14 may not meet (or contact) each other on the display panel DP. Therefore, the second area AR2, the third area AR3, the fourth area AR4, and the fifth area AR5 may not affect each other (e.g., may not obstruct each other) when each of the second to fifth areas AR2 to AR5 is bent.

The sixth area AR6 may include an upper area (e.g., a first non-display area) AR-H, a bending area BA, and a lower area (e.g., a second non-display area) AR-L.

The upper area AR-H may extend from the fourth area AR4, the bending area BA may extend from the upper area AR-H, and the lower area AR-L may extend from the bending area BA.

The input detection sensor ISS may be disposed on the display panel DP. The input detection sensor ISS may be directly placed on the display panel DP or may be attached to the display panel DP by an adhesive member.

The input detection sensor ISS may include a plurality of sensors. Each of the sensors may be capacitively coupled to other adjacent sensors. When a user touches the display areas DA1, DA2, DA3, DA4, and DA5 of the display device DD, the display device DD may detect a variation in capacitance between the sensors and may determine whether or not the user is touching the display device DD and, if so, positions where the user's touch occurs.

The data driver circuit DIC and pads PD may be mounted on the lower area AR-L of the display panel DP. The pads PD may be electrically connected to light emitting elements LD (see, e.g., FIG. 4).

The data driver circuit DIC may provide data signals to the display areas DA1, DA2, DA3, DA4, and DA5 of the display panel DP.

The display panel DP may be electrically connected to the printed circuit board PCB-M through the pads PD.

The printed circuit board PCB-M may be electrically connected to the pads PD of the display panel DP.

The control circuit CIC may be mounted on the printed circuit board PCB-M. The control circuit CIC may control the data driver circuit DIC.

The support member SPT may be disposed below the display module DM. The support member SPT may support at least one of the components of the display module DM.

The frame FRM may be disposed below the support member SPT. The frame FRM may accommodate the support member SPT, the display module DM, and at least a portion of the window member WM.

In an embodiment, the frame FRM may be in combination with (e.g., may be coupled to) the window member WM.

Figure 3:
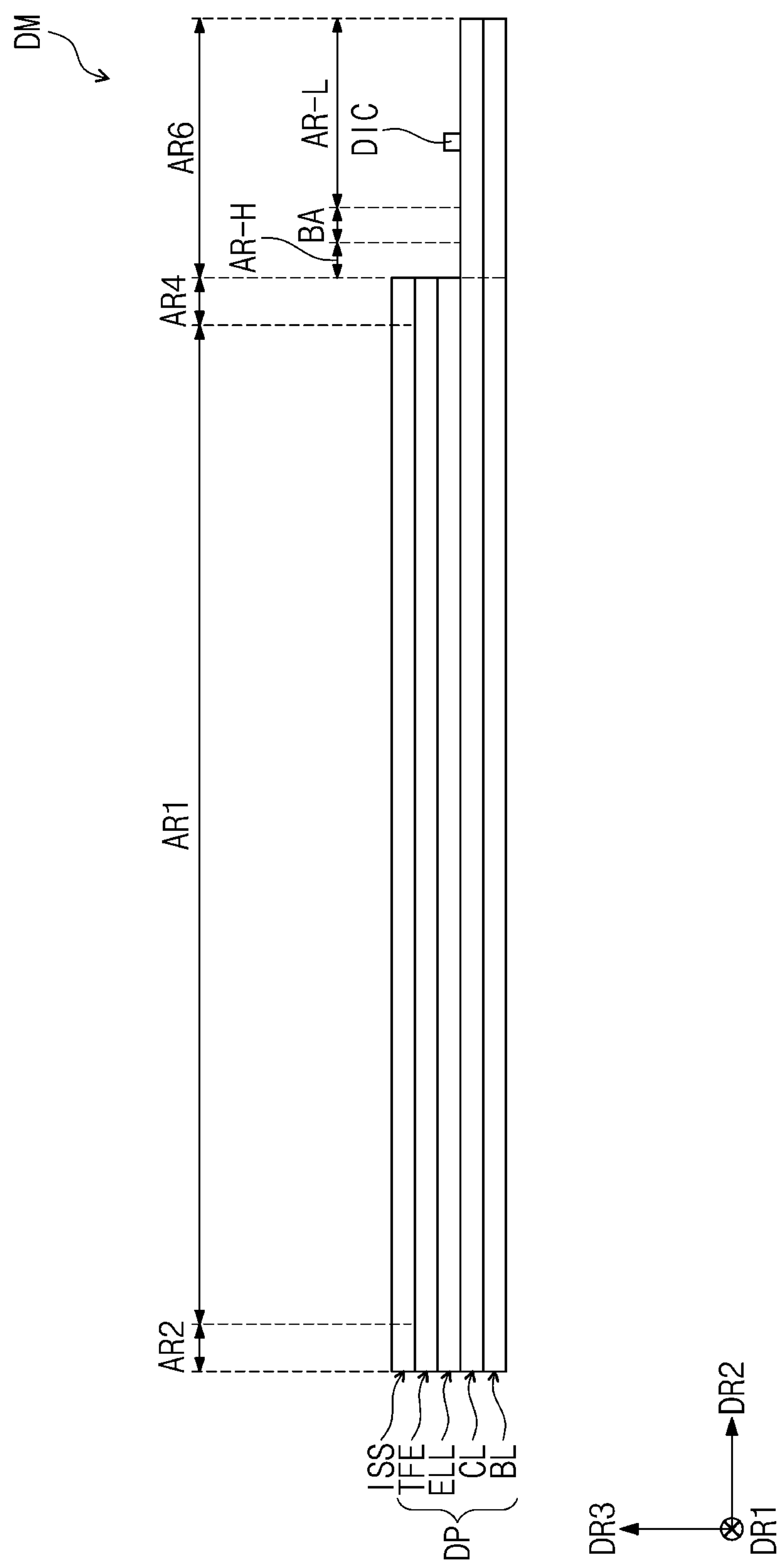
FIG. 3 is a cross-sectional view of a display module according to an example embodiment of the present inventive concepts.
Figure 4:
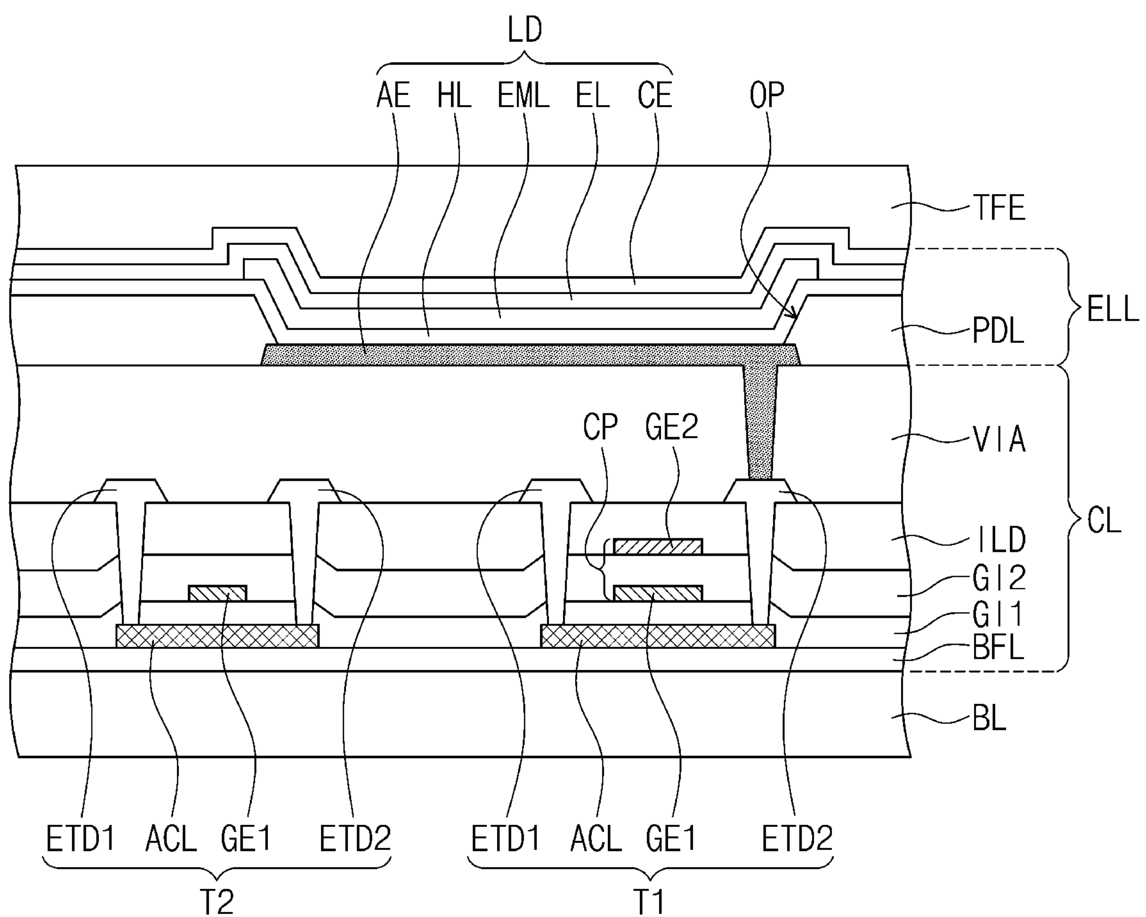
FIG. 4 is a cross-sectional view of a portion of a display panel according to an example embodiment of the present inventive concepts.

FIG. 3 is a cross-sectional view of the display module DM according to an example embodiment of the present inventive concepts, and FIG. 4 is a cross-sectional view of a portion of the display panel DP according to an example embodiment of the present inventive concepts.

The display panel DP may include a base layer BL, a circuit layer CL, a light emitting element layer ELL, and an encapsulation layer TFE.

The base layer BL may include, for example, polyimide (PI). The material included in the base layer BL, however, is not limited thereto.

The circuit layer CL may include a buffer layer BFL, gate dielectric layers GI1 and GI2, an interlayer dielectric layer ILD, a circuit dielectric layer VIA, and transistors T1 and T2. The buffer layer BFL, the gate dielectric layers GI1 and GI2, the interlayer dielectric layer ILD, and the circuit dielectric layer VIA may each include an organic material or an inorganic material.

Each of the transistors T1 and T2 may include an input electrode EDT1, an output electrode ETD2, a control electrode GE1, and an activation layer ACL.

The control electrode GE1 and another electrode GE2 with the second gate dielectric layer GI2 therebetween may constitute a capacitor CP.

The light emitting element layer ELL may include a light emitting element LD and a pixel defining layer PDL. The light emitting element LD may include an anode electrode AE, a hole control layer HL, a light emitting layer EML, an electron control layer EL, and a cathode electrode CE.

The pixel defining layer PDL may have an opening OP that exposes the anode electrode AE of the light emitting element LD.

The encapsulation layer TFE may encapsulate and protect the light emitting element layer ELL from external oxygen and/or moisture. The encapsulation layer TFE may be a layer in which organic and inorganic layers are mixed with (or stacked on) each other.

Figure 5:
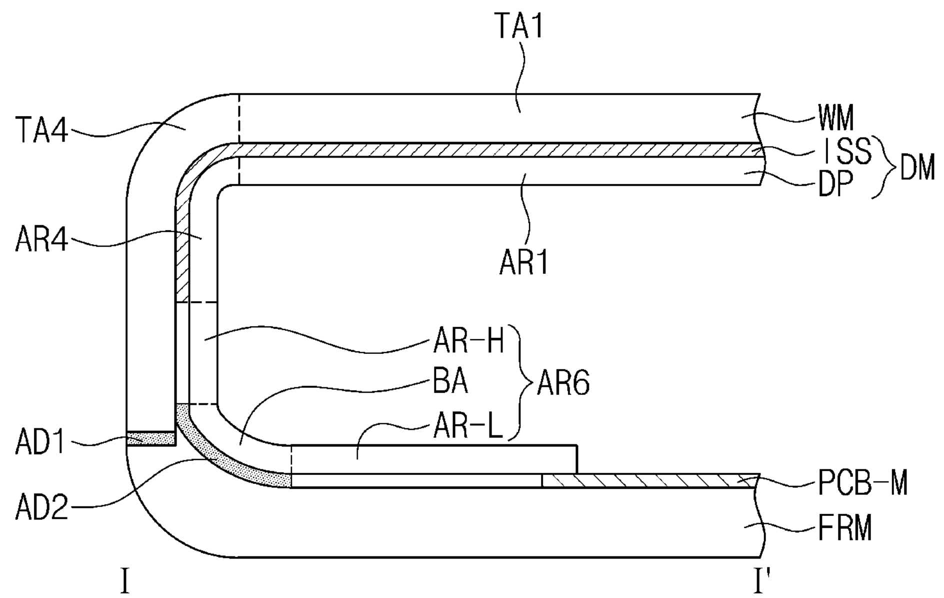
FIG. 5 is a partial cross-sectional view taken along the line I-I' of FIG. 1.
Figure 6:
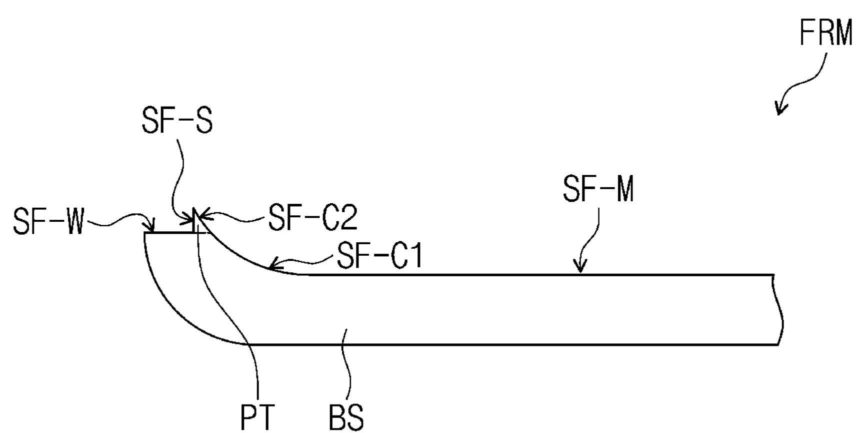
FIG. 6 is a cross-sectional view of a frame shown in FIG. 5.

FIG. 5 is a cross-sectional view taken along the line I-I' of FIG. 1, and FIG. 6 is a cross-sectional view showing the frame FRM shown in FIG. 5.

The bending area BA of the sixth area AR6 of the display panel DP may be bent.

In an embodiment, the bending of the bending area BA may cause the upper area AR-H and the lower area AR-L to form an angle of about 80° to about 100°, preferably about 90°, therebetween. Therefore, the lower area AR-L of the sixth area AR6 may be disposed parallel to the first area AR1. In this case, a stress applied to the bending area BA may be reduced to prevent the display panel DP from being damaged during the process of fabricating the display device DD.

The frame FRM may be coupled to the window member WM by a first adhesive member AD1, and the frame FRM may be coupled to the bending area BA of the display panel DP by a second adhesive member AD2. However, the present inventive concepts are not limited thereto, and in other embodiments, the second adhesive member AD2 may be omitted.

Referring to FIG. 6, the frame FRM may include a base frame BS and a protrusion PT.

The base frame BS may have a window support surface SF-W, a first curved surface SF-C1, and a main support surface SF-M.

The window support surface SF-W may support the window member WM. The first adhesive member AD1 may be disposed on the window support surface SF-W.

The first curved surface SF-C1 may be spaced apart from the window support surface SF-W. The first curved surface SF-C1 may have a curvature. The first curved surface SF-C1 may support the bending area BA of the display panel DP.

The main support surface SF-M may extend from the first curved surface SF-C1. The main support surface SF-M may support one or more of the integrated circuit board PCB-M and the lower area AR-L of the display panel DP.

The protrusion PT may protrude from the base frame BS. The protrusion PT may be disposed between the fourth transmission part TA4 of the window member WM and the sixth area AR6 of the display panel DP.

The protrusion PT may have a second curved surface SF-C2 and a side surface SF-S.

The second curved surface SF-C2 may extend from the first curved surface SF-C1. The second curved surface SF-C2 may have a curvature. The second curved surface SF-C2 and the first curved surface SF-C1 may support the bending area BA of the display panel DP.

The side surface SF-S may extend in a direction crossing (e.g., intersecting or normal to) the window support surface SF-W. The side surface SF-S may connect (e.g., may extend between) the window support surface SF-W to the second curved surface SF-C2.

The second adhesive member AD2 may be disposed on the first curved surface SF-C1 and the second curved surface SF-C2.

In an embodiment, the main support surface SF-M may be located at a lower height from a bottom surface of the base frame BS than that of the window support surface SF-W (e.g., the window support surface SF-W may be above the main support surface SF-M due to the first curved surface SF-C1).

Figure 7A:
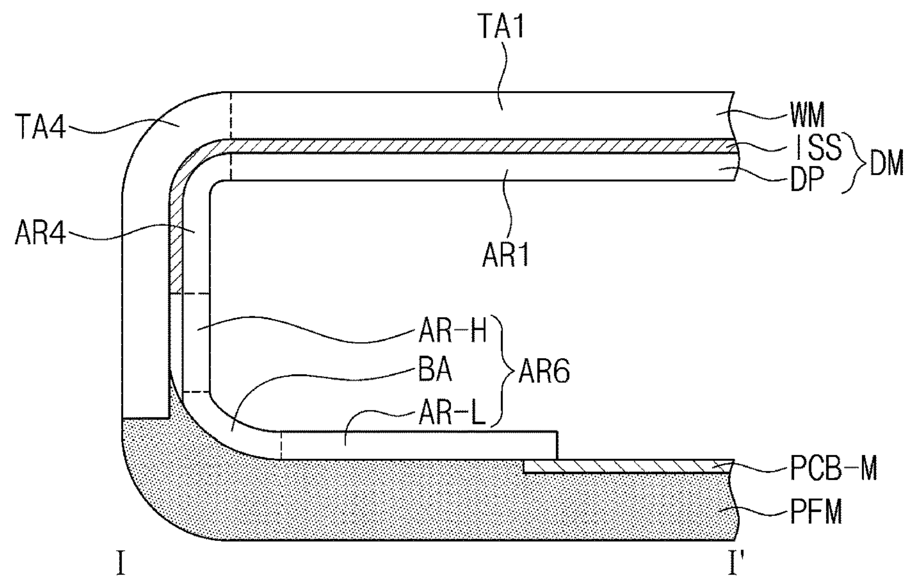
FIG. 7A is a cross-sectional view of a temporary fixing frame coupled with a display module and a window member according to an example embodiment of the present inventive concepts.
Figure 7B:
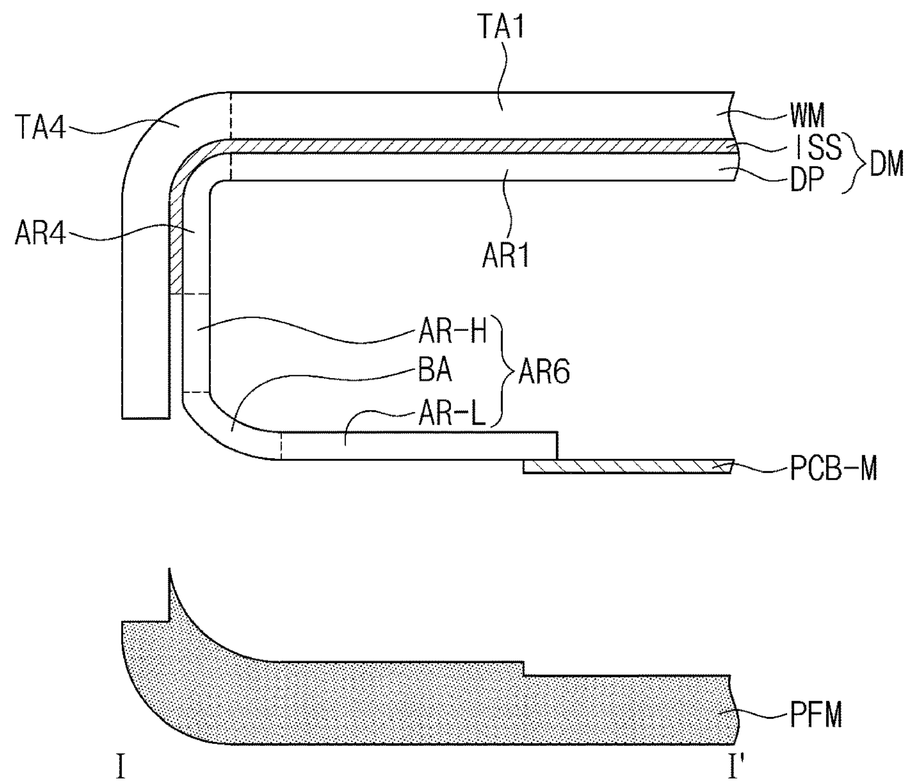
FIG. 7B is a cross-sectional view showing removal of the temporary fixing frame from the display module and the window member depicted in FIG. 7A.
Figure 7C:
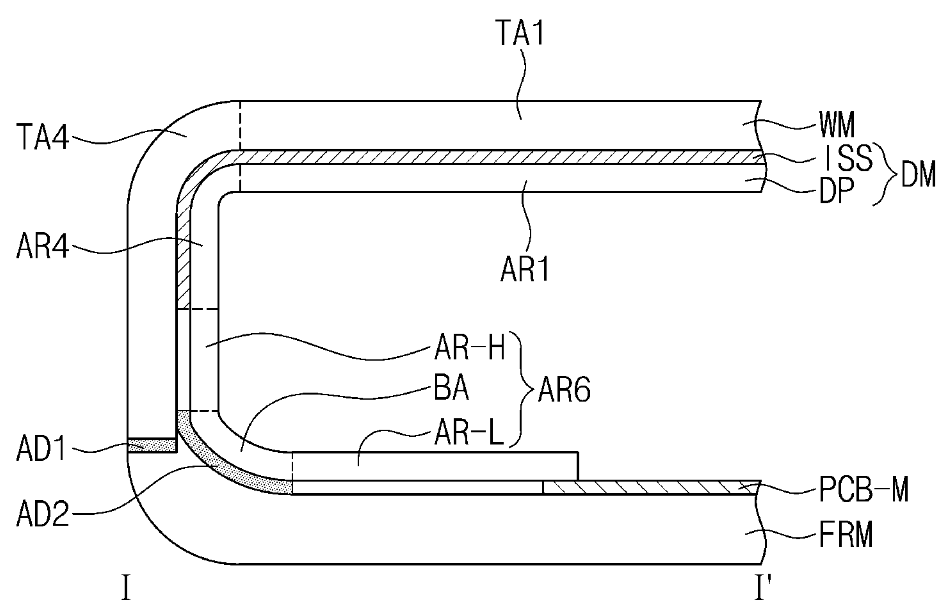
FIG. 7C is a cross-sectional view showing a frame coupled with the display module and the window member after the removal of the temporary fixing frame depicted in FIG. 7B.

FIG. 7A is a cross-sectional view of a temporary fixing frame PFM in combination with (e.g., coupled to) the display module DM and the window member WM according to an example embodiment of the present inventive concepts, FIG. 7B is a cross-sectional view showing removal of the temporary fixing frame PFM from the display module DM and the window member WM depicted in FIG. 7A, and FIG. 7C is a cross-sectional view of the frame FRM in combination with (e.g., coupled to) the display module DM and the window member WM after the removal of the temporary fixing frame PFM depicted in FIG. 7B.

Referring to FIG. 7A, the temporary fixing frame PFM may be used to maintain the bending shape of the sixth area AR6 during (e.g., in the middle of) processing or circulating the display module DM and the window member WM. The temporary fixing frame PFM may have a shape that corresponds to that of the frame FRM, and therefore, it may be possible to stably maintain a shape of the display panel DP until the frame FRM is coupled to the display panel DP.

Referring to FIGS. 7B and 7C, after the temporary fixing frame PFM is removed, the frame FRM may be coupled to the display module DM and the window member WM.

Figure 8A:
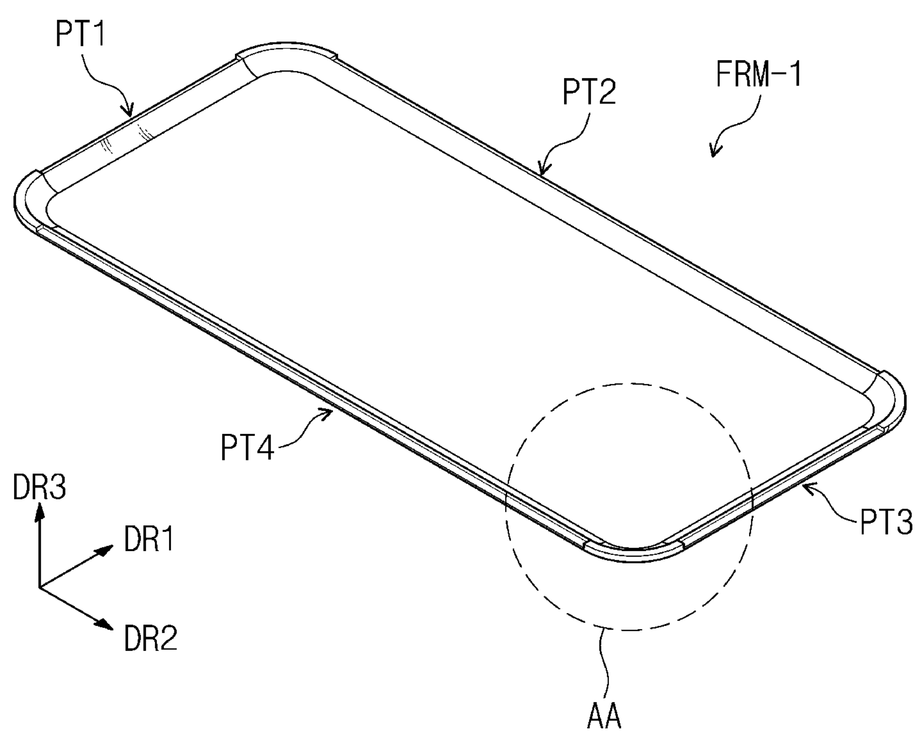
FIG. 8A is a perspective view of a frame according to an example embodiment of the present inventive concepts.
Figure 8B:
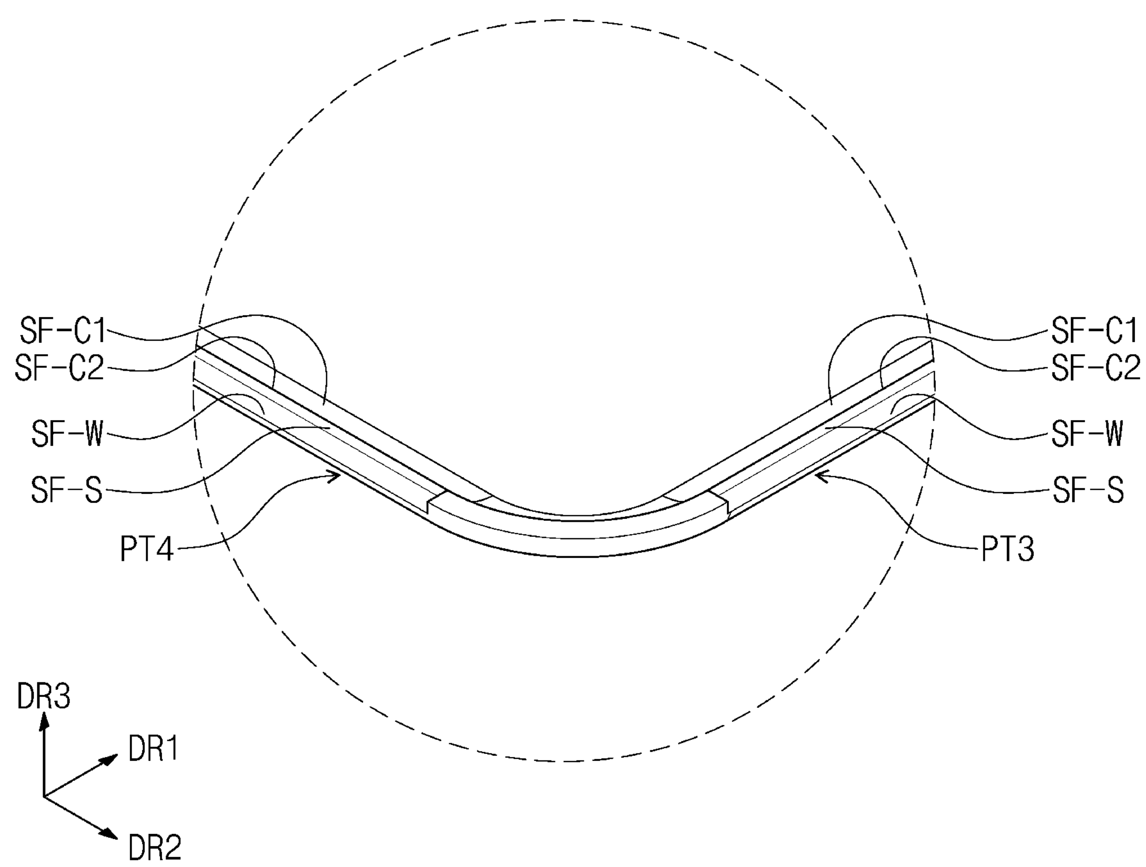
FIG. 8B is an enlarged view of the section AA of FIG. 8A.

FIG. 8A is a perspective view showing a frame FRM-1 according to an example embodiment of the present inventive concepts, and FIG. 8B is an enlarged view showing the section AA of FIG. 8A.

Referring to FIGS. 6 and 8A, the frame FRM-1 may include a first protrusion PT1, a second protrusion PT2, a third protrusion PT3, and a fourth protrusion PT4. Each of the first, second, third, and fourth protrusions PT1, PT2, PT3, and PT4 may protrude from the base frame BS and may have a shape that corresponds to that of the protrusion PT shown in FIG. 6.

Additionally referring to FIG. 2, the first protrusion PT1 may be disposed adjacent to the second transmission part TA2 of the window member WM. The first protrusion PT1 may extend parallel to the first side ED11 of the first area AR1.

The second protrusion PT2 may be disposed adjacent to the third transmission part TA3 of the window member WM. The second protrusion PT2 may extend parallel to the second side ED12 of the first area AR1.

The third protrusion PT3 may be disposed adjacent to the fourth transmission part TA4 of the window member WM. The third protrusion PT3 may extend parallel to the third side ED13 of the first area AR1.

The fourth protrusion PT4 may be disposed adjacent to the fifth transmission part TA5 of the window member WM. The fourth protrusion PT4 may extend parallel to the fourth side ED14 of the first area AR1.

Referring to FIG. 8B, each of the third protrusion PT3 and the fourth protrusion PT4 may include the side surface SF-S and the second curved surface SF-C2. The window support surface SF-W and the first curved surface SF-C1 may be disposed adjacent to each of the third protrusion PT3 and the fourth protrusion PT4.

Figure 9:
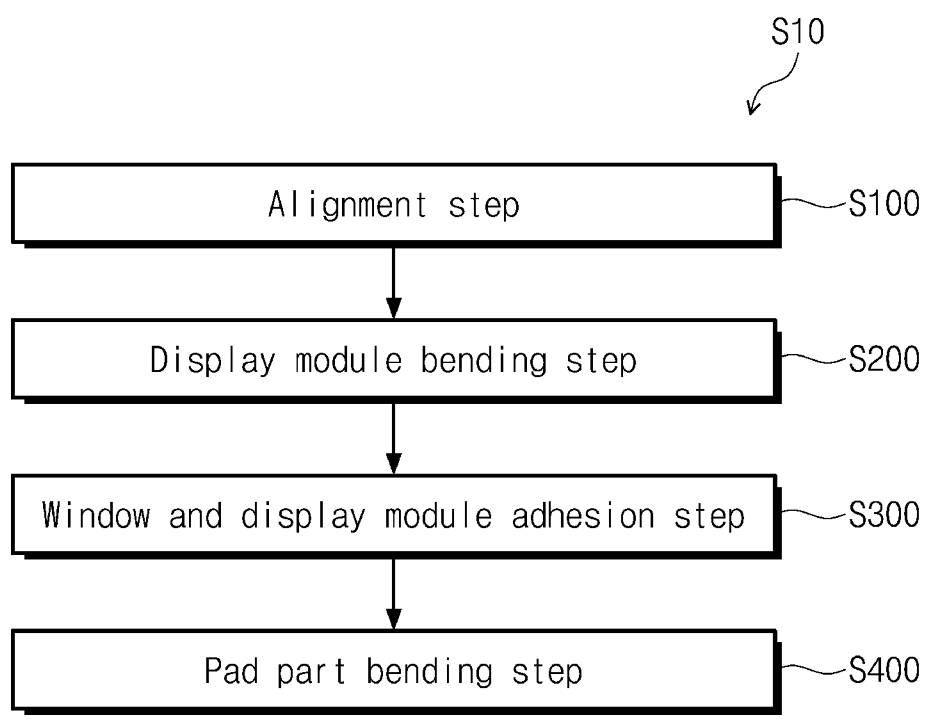
FIG. 9 is a flow chart showing a method of fabricating a display device according to an example embodiment of the present inventive concepts.

FIG. 9 is a flow chart showing a method S10 of fabricating a display device according to an example embodiment of the present inventive concepts, and FIGS. 10A, 10B, 10C, and 10D are cross-sectional views showing a method of fabricating a display device according to an example embodiment of the present inventive concepts.

Referring to FIG. 9, the display device fabrication method S10 may include an alignment step S100, a display module bending step S200, a window and display module adhesion step S300, and a pad part bending step S400.

Figure 10A:
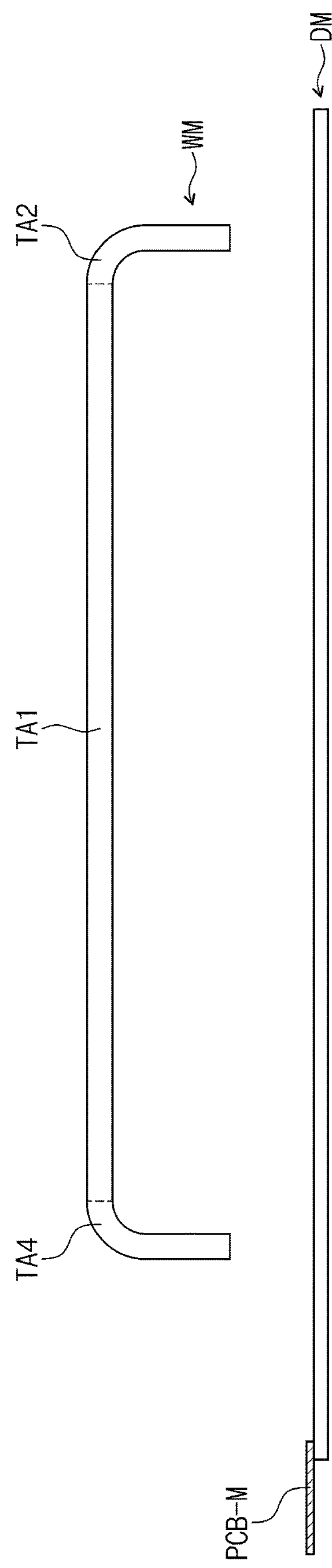
FIGS. 10A to 10D are cross-sectional views showing a method of fabricating a display device according to an example embodiment of the present inventive concepts.

Referring to FIGS. 9 and 10A, at the alignment step S100, the window member WM and the display module DM may be aligned to correspond to each other.

Figure 10B:
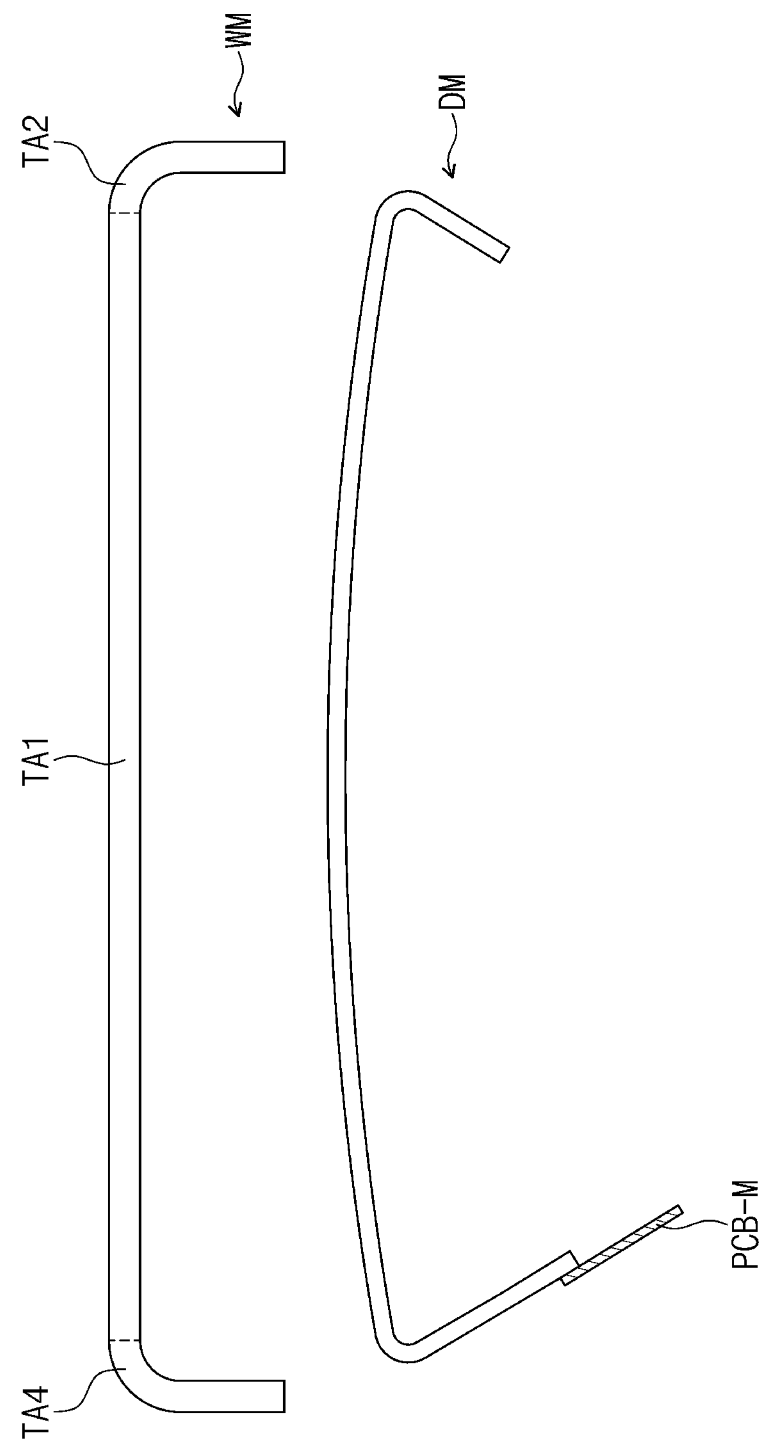

Referring to FIGS. 9 and 10B, at the display module bending step S200, a portion of the display module DM is bent. For example, the display module DM may be bent to have a first curvature at a portion that corresponds to the first transmission part TA1 of the window member WM and may also be bent to have a second curvature, which is greater than the first curvature, at portions thereof that correspond to the second and fourth transmission parts TA2 and TA4 of the window member WM.

Figure 10C:
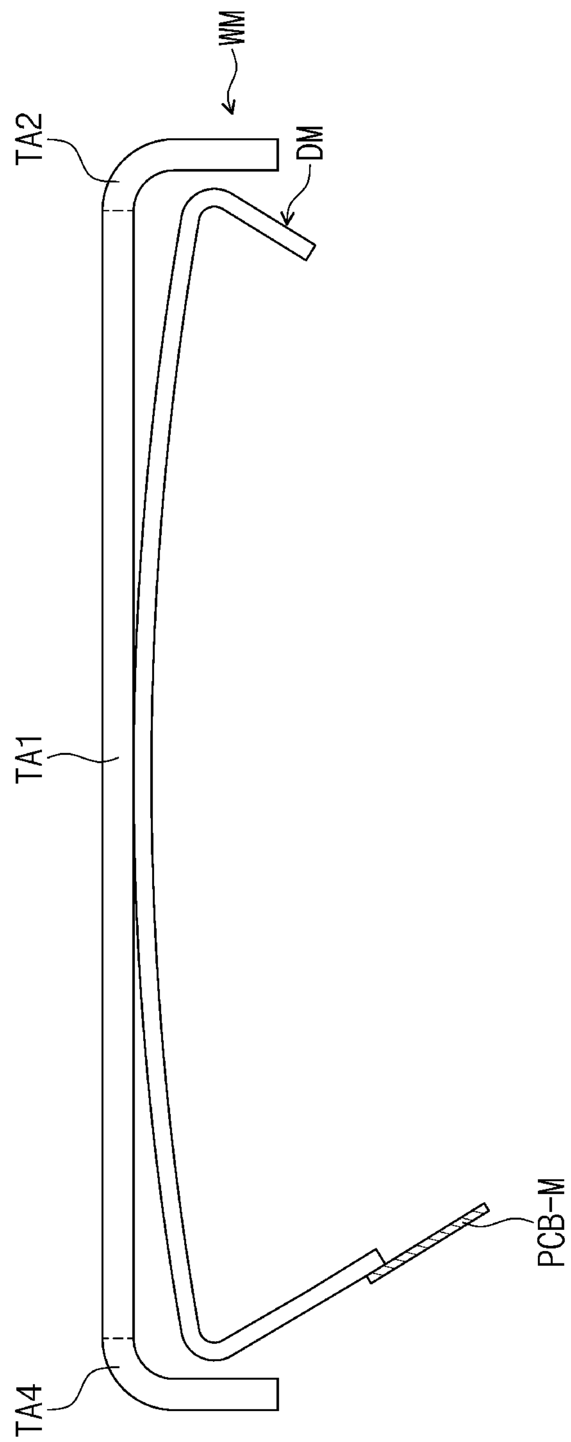

Referring to FIGS. 9 and 10C, at the window and display module adhesion step S300, the window member WM may be attached with the display module DM that was previously bent at the display module bending step S200. A transparent adhesive may be disposed between the display module DM and the window member WM.

Figure 10D:
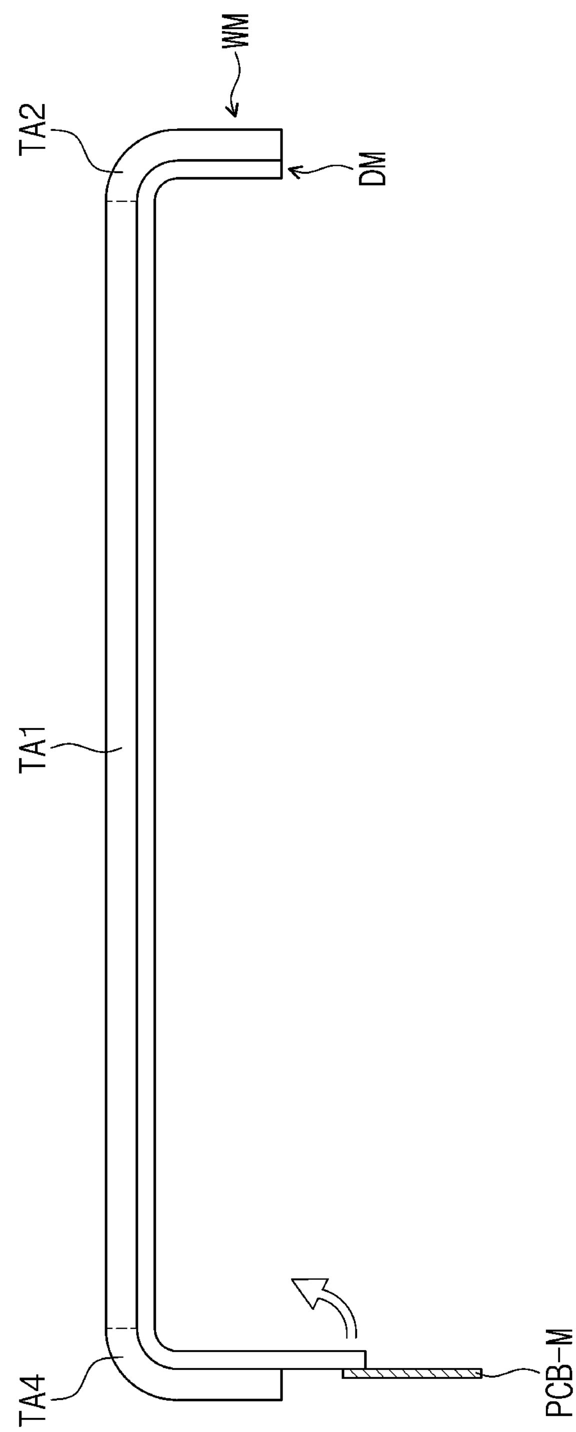

Referring to FIGS. 9 and 10D, at the pad part bending step S400, a portion of the display module DM may be bent such that the printed circuit board PCB-M may be disposed parallel to the first transmission part TA1.

According to some example embodiments of the present inventive concepts, four edge portions of the display device may be bent to have a curvature (e.g., a certain curvature) to improve aesthetic impressions of the display device.

Further, stress applied to one or more components of the display device during fabrication may be reduced to increase the durability of the display device.

Although the present inventive concepts are described in conjunction with some example embodiments thereof, it would be understood by those skilled in the art that the present inventive concepts can be modified or changed in various ways without departing from spirit and scope of the present inventive concepts as defined by the appended claims and their equivalents. Further, the embodiments disclosed herein are not intended to limit the technical spirit of the present inventive concepts, and all technical spirit within the claims and their equivalents should be construed as being included in the present inventive concepts.

What is claimed is:

1. A display device comprising:

a display panel comprising a plurality of light emitting elements and a plurality of pads electrically connected to the plurality of light emitting elements, the display panel having:

a first area having a first side, a second side extending in a direction crossing the first side, a third side parallel to the first side, and a fourth side parallel to the second side;

a second area extending from the first side, at least a portion of the second area being bent;

a third area extending from the second side, at least a portion of the third area being bent;

a fourth area extending from the third side, at least a portion of the fourth area being bent;

a fifth area extending from the fourth side, at least a portion of the fifth area being bent; and a sixth area having an upper area extending from the fourth area, a bending area extending from the upper area, and a lower area extending from the bending area, the plurality of pads being on the lower area;

a printed circuit board electrically connected to the plurality of pads; and a window member above the display panel, the window member having:

a first transmission part overlapping the first area;

a second transmission part overlapping the second area, at least a portion of the second transmission part being bent;

a third transmission part overlapping the third area, at least a portion of the third transmission part being bent;

a fourth transmission part overlapping the fourth area, at least a portion of the fourth transmission part being bent; and a fifth transmission part overlapping the fifth area, at least a portion of the fifth transmission part being bent, wherein the bending area of the sixth area is bent such that the lower area of the sixth area and the printed circuit board are parallel to the first area.

2. The display device of claim 1, wherein an angle between the upper area and the lower area is in a range from 80° to 100°.

3. The display device of claim 1, further comprising:

a frame below the display panel.

4. The display device of claim 3, wherein the frame comprises:

a base frame supporting one or more of the printed circuit board and a portion of the display panel; and a protrusion protruding from the base frame and being between the fourth transmission part of the window member and the sixth area of the display panel.

5. The display device of claim 4, wherein the base frame has:

a window support surface supporting the window member;

a first curved surface supporting the bending area of the display panel and spaced apart from the window support surface, the first curved surface having a curvature; and a main support surface supporting one of the printed circuit board and the lower area of the display panel, the main support surface extending from the first curved surface.

6. The display device of claim 5, wherein the protrusion has:

a second curved surface supporting the bending area of the display panel and extending from the first curved surface, the second curved surface having a curvature; and a side surface extending in a direction intersecting the window support surface and extending between the window support surface and the second curved surface.

7. The display device of claim 6, further comprising an adhesive member between the window support surface and the window member.

8. The display device of claim 6, further comprising an adhesive member between the first curved surface and the bending area of the display panel.

9. The display device of claim 3, further comprising a support member supporting the display panel, at least a portion of the support member being between the display panel and the frame.

10. The display device of claim 3, wherein the frame comprises:

a base frame supporting one or more of the printed circuit board and a portion of the display panel;

a first protrusion protruding from the base frame and adjacent to the second transmission part of the window member, the first protrusion extending parallel to the first side;

a second protrusion protruding from the base frame and adjacent to the third transmission part of the window member, the second protrusion extending parallel to the second side;

a third protrusion protruding from the base frame and adjacent to the fourth transmission part of the window member, the third protrusion extending parallel to the third side; and a fourth protrusion protruding from the base frame and adjacent to the fifth transmission part of the window member, the fourth protrusion extending parallel to the fourth side.

11. The display device of claim 1, wherein the first side, the second side, the third side, and the fourth side of the first area do not contact each other.

12. A display device comprising:

a display panel;

a window member above the display panel; and a frame below the display panel, wherein the display panel has:

a main display area;

a sub-display area extending from the main display area, at least a portion of the sub-display area being bent;

a first non-display area extending from the sub-display area;

a bending area extending from the first non-display area; and a second non-display area extending from the bending area, a data driver circuit being mounted on the second non-display area, wherein the bending area is bent such that the second non-display area is parallel to the main display area, wherein the window member has:

a main transmission part overlapping the main display area; and a sub-transmission part overlapping the sub-display area, and wherein the frame comprises:

a base frame; and a protrusion protruding from the base frame and being between the sub-transmission part of the window member and the bending area of the display panel.

13. The display device of claim 12, wherein an angle between the first non-display area and the second non-display area is in a range from 80° to 100°.

14. The display device of claim 13, wherein the main display area and the sub-display area comprise a plurality of light emitting elements, wherein the second non-display area comprises a plurality of pads that are configured to transmit an electrical signal to the plurality of light emitting elements, and wherein the display device further comprises a printed circuit board that is electrically connected to the plurality of pads and is parallel to the main display area.

15. The display device of claim 12, wherein the base frame has:

a window support surface supporting the window member;

a first curved surface spaced apart from the window support surface and supporting the bending area of the display panel, the first curved surface having a curvature; and a main support surface supporting the second non-display area of the display panel and extending from the first curved surface.

16. The display device of claim 15, wherein the protrusion has:

a second curved surface supporting the bending area of the display panel and extending from the first curved surface, the second curved surface having a curvature; and a side surface extending in a direction crossing the window support surface and extending between the window support surface and the second curved surface.

17. The display device of claim 15, further comprising an adhesive member between the window support surface and the window member.

18. The display device of claim 15, further comprising an adhesive member between the first curved surface and the bending area of the display panel.

* * * * *